Jan. 19, 1954 L. P. HUNTER 2,666,816

SEMICONDUCTOR AMPLIFIER

Filed Oct. 20, 1950

WITNESSES:

Robert C. Baird
Wm. T. Wofford

INVENTOR
Lloyd P. Hunter.
BY F. E. Browder
ATTORNEY

Patented Jan. 19, 1954 2,666,816

UNITED STATES PATENT OFFICE 2,666,816

SEMICONDUCTOR AMPLIFIER

Lloyd P. Hunter, Pittsburgh, Pa., assignor to Westinghouse Electric Corporation, East Pittsburgh, Pa., a corporation of Pennsylvania Application October 20, 1950, Serial No. 191,300

2 Claims. (Cl. 179—171)

Figure 1:
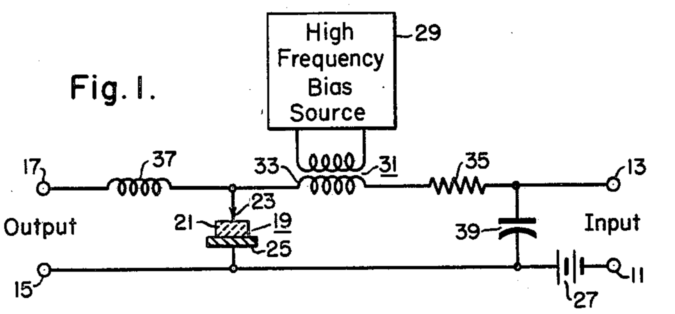

My invention relates generally to electronic amplifiers, and more particularly to amplifiers employing semi-conductor amplifying elements.

A great deal of effort has been expended in the search for an electronic amplifier element which does not involve a vacuum or require a filament. Much of this effort has, in recent years, been directed to the field of semi-conductors. Some operable amplifiers employing semi-conductor elements have in fact been made. Notable among these, is an amplifier employing a semi-conductor amplifying element, which has been termed a transistor.

The transistor generally comprises a block of suitable semi-conductive material which may be silicon or germanium, with which there are associated three electrodes. One of these electrodes, called the base electrode, is a plate of conductive material which is placed contiguous to one face of the semi-conductor block, so as to form a low resistance contact. The other two electrodes are pin-pointed conductive probes, located in proximity, in constant with the opposite face of the semi-conductor block. If one of the pin-point electrodes, which may be called the collector, is biased strongly in the low-conducting direction, and a bias is placed on the other pin-point electrode, called the emitter, of such a sense as cause it to emit carriers of the sign not normally present in the interior of the semi-conductive block, then the collector will be influenced by the emitter, and amplification may take place.

The transistor of the type having two pin-point electrodes has been found subject to a number of inherent disadvantages. A method has not yet been found for making a semi-conductive block having uniform surface characteristics of the type necessary to make a good transistor at all points of the surface. The surface of each particular block must be searched for properly sensitive areas. An area suitable for location of a collector electrode may not be suitable for location of an emitter electrode. The spacing of the emitter and collector electrodes for optimum results must be very small; usually not more than five mils. Hence it is necessary in making a transistor, not only to find areas on the surface of the semi-conductive which are suitable for emitter and collector locations, but to find such areas within a spacing of not more than 5 mils. This is a tedious and time consuming operation. Once the emitter and collector electrodes have been properly set on the surface of the semi-conductor block, there arises the problem of preventing displacement of these electrodes. The delicate emitter and collector electrodes being so closely spaced, have a strong tendency to short out due to either displacement or to the formation of a conducting layer over the semi-conductor surface between the electrodes.

It is an object of my invention to provide an improved semi-conductor amplifier.

It is another object of my invention to provide a semi-conductor amplifier with which there is associated no problem of pin-point electrode spacing.

It is another object of my invention to provide a semi-conductor amplifier with which there is associated no problem of electrode shorting.

It is a further object of my invention to provide a semi-conductor amplifier such that the problem of proper pin-point electrode location is greatly reduced.

It is a further object of my invention to provide a semi-conductor amplifier which shall be less susceptible to damage due to shock and vibration.

It is a still further object of my invention to provide a semi-conductor amplifier in which the amplifying element can be made substantially smaller than those of the prior art.

In accordance with my invention, I provide an electronic amplifier which employs a semi-conductor amplifying element having a single pin-point electrode. The amplifying element may be any suitable semi-conductor diode in which the pin-point electrode can be located on an area of the surface of the semi-conductor material which enables it to both emit and collect current carriers when the proper biases are applied. To such a suitable semi-conductor diode I apply a strong direct current bias in the low conducting direction. In addition, I apply a high frequency bias, the half-period of which is short compared to the life of an anomalous current carrier, and the peak amplitude of which is somewhat greater than the magnitude of the direct current bias. I further provide means for isolating this high frequency bias from the input and output terminals of the amplifier. As a result, there is a self-biasing action in the semi-conductor diode, and a suitable signal applied to the input terminals will appear as an amplified signal at the output terminals. The input signal may have any desired frequency that is lower than and can be separated from the high frequency bias by available filtering means.

Figure 2:
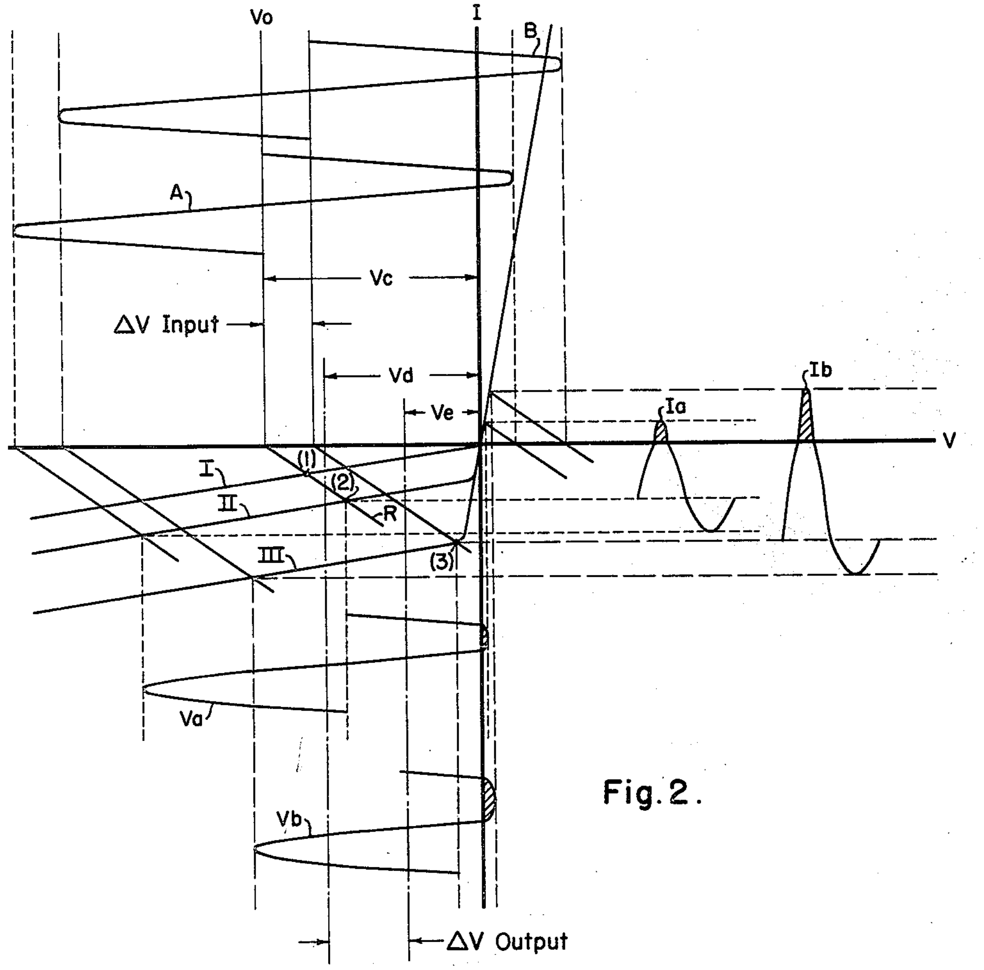

My invention will be best understood from the following description of a specific embodiment when taken together with the accompanying drawing, in which:

Figure 1 is a schematic circuit diagram of an amplifier constructed in accordance with the teaching of my invention, and Fig. 2 is a graphical representation, illustrating the principle of operation of my invention.

In Fig. 1 there is shown a schematic circuit diagram of an amplifier made in accordance with my invention, and having first and second input and output terminals 11, 13, 15 and 17, respectively. The amplifying element is a semi-conductor diode 19 comprising a block of semi-conductor material 21, a pin-point electrode 23, and a base electrode 25. By pin-point electrode, I mean an electrode having an end suitably shaped to make a good, small area contact with semi-conductor material. The semi-conductor block 21 may be made of any semi-conductor material susceptible to hole or electron injection, but is preferably germanium. The base electrode 25 is made of a material, such as copper or brass, which is a good electrical conductor, and is fixed to one face of the semi-conductor block 21 so that it makes a large area, low resistance contact therewith. The pin-point electrode 23 may be made of any suitable material, such as phosphor bronze. The pin-point electrode 23 is arranged to make a rectifying small area contact with a properly sensitive area of the face of the semi-conductor block 21 opposite the base electrode 25.

The semi-conductor diode 19 is given a direct current bias in the low conducting direction by connection of a direct current bias source, shown as a battery 27, between the base electrode 25 and the first input terminal 11. It is assumed that the semi-conductor block 21 of the diode 19 shown is "N"-type, and the positive terminal of the battery 27 is, therefore, shown connected to the base electrode 25. A high frequency bias source 29 is connected to place its output in series with the diode 19 and the battery 27. By high frequency bias, I mean a bias having a frequency such that its half-period is short compared to the life of an anomalous current carrier. The anomalous current carrier would be a hole in the case of "N" type semi-conductor material, and an electron in the case of a "P" type semi-conductor material. For the theory of semi-conduction, see Crystal Rectifiers, Torrey and Whitmer, McGraw-Hill, 1948. The high frequency bias source 29 may be any one of a number of high frequency generators well known in the art, and is therefore not shown in detail. For example, a vacuum tube oscillator, capable of generating a one megacycle output, may be used. The high frequency bias source 29 may be coupled to the diode circuit by any suitable means. In the drawing, the coupling means is shown as a transformer 31, the secondary 33 of which is connected between the pin-point electrode 23 of the diode 19 and the second input terminal 13. A resistor 35 is shown in series with the diode 19 and battery 27 and connected between the transformer secondary 33 and the second input terminal 13. It is understood that this resistor 35 could be eliminated if there were enough resistance inherently present in the series circuit of the diode 19 and battery 27 to establish a load line having a reasonable slope, as will become hereinafter more apparent. The high frequency bias is isolated from the input and output terminals by suitable means, shown as a choke coil 37 connected between the pin-point electrode 23 and the second output terminal 17, and a capacitor 39 connected between the second input terminal 13 and the positive terminal of the battery 27. The choke coil 37 should be designed to present a high impedance to the high frequency bias, and a low impedance to the amplified signal. The capacitor 39 should be designed to act as a shunt for the high frequency bias and as a high impedance to the amplifier input signal.

For explanation of the principle of operation of my invention, reference is now made to the graphical representation of Fig. 2. In general, in Fig. 2, current, I, is plotted as ordinate and voltage, V, as abscissa. The curves labeled I, II, III, are the current-voltage characteristics of the semi-conductor diode 19, under various operating conditions. The curves labeled A and B represent the voltage of the high frequency bias source 29. The curves marked $I_a$, $I_b$, $V_a$, and $V_b$, represent the diode voltage and current for conditions corresponding to curves A and B, respectively. The meaning of other designations in Fig. 2 will be made clear infra.

Assume that curve I is the characteristic of the semi-conductor diode in the absence of current carrier injection. If now a bias from the battery 27 of magnitude $V_c$ is applied, and a load line R is drawn, the operating point on the diode characteristic will be point (1). If then the high frequency bias is applied, the load line R will be caused to scan the diode characteristic between the limits of the positive and negative peaks of the high frequency bias voltage (curve *A*). The short dotted lines of Fig. 2 show how the diode current and voltage curves $I_a$, and $V_a$, respectively, coresponding to high frequency bias voltage curve A, may be graphically constructed. It will be noted that the driving of the diode into the positive voltage region causes a sharp positive peak or spike to appear on the diode current curve $I_a$. The area shown cross-hatched is the positive spike area. This spike, or peak, means that holes have been injected in the diode semi-conductor material (for an "N"-type semi-conductor diode). Injection of holes causes the diode characteristic to shift to curve II, establishing a new operating point (2), and the diode voltage wave is non-symmetrical about the direct current voltage determined by the operating point (2). If an average value of diode voltage (curve $V_a$) is taken, it will be seen that a self-biasing action has occurred in the diode, and the net direct current voltage across the diode now has magnitude $V_d$.

Suppose now that a signal has been applied to the input terminals of the amplifier and that the instantaneous positive voltage maximum magnitude is as represented by $\Delta V$ input, in Fig. 2. The high frequency bias is shifted to the right and the load line R now scans the diode characteristic between the limits of curve B. The diode is driven still further into the positive voltage region. The diode voltage and current are now as represented by curves $V_b$ and $I_b$, respectively. Further hole injection occurs, shifting the diode characteristic to curve III, and establishing a new operating point (3). An average of the diode voltage curve $V_b$ shows that the direct current voltage across the diode is now of magnitude $V_e$. The output voltage, which is equal to $V_d$ minus $V_e$, is designated $\Delta V$ output. The voltage gain, or amplification factor, then is the ratio of $\Delta V$ output to $\Delta V$ input.

It is realized of course that in actual operation the steps described supra, in fact take place substantially instantaneously, and were described separately only for the purpose of explaining the principle of operation of my invention. The second condition described (operating point (2) and curves B, $V_a$ and $V_b$) is assumed to be the condition of equilibrium.

The frequency of the high frequency bias is limited only by the qualification that the time for a half-period must be short compared to the life of an anomalous current carrier in the semiconductor material. The frequency of the input signal is limited only by practical design considerations. In other words, the input signal may be of any frequency lower than the frequency of the high frequency bias and providing there are means available for passing it to the amplifier output terminals and at the same time isolating the high frequency bias from the input and output terminals.

While I have described my invention as applied to an "N" type semi-conductor diode, the principles of my invention can be equally well applied to a "P" type semi-conductor diode, and the manner of such application will appear obvious to those skilled in the art, from the description supra.

It will be seen from the foregoing, that I have devised a semi-conductor diode amplifier which obviates the aforementioned disadvantages which are inherent in the transistor of the double pinpoint electrode type. Further, it should be noted that the diode amplifying element used in the amplifier of my invention, can be made much smaller than the transistor.

Arrangements other than the specific embodiment herein shown and described, and embodying the principles of my invention, will occur to those skilled in the art. Consequently, I wish to be limited in the interpretation of my invention only insofar as is necessitated by the prior art and the spirit of the appended claims.

I claim as my invention:

1. A semi-conductor amplifier comprising a semi-conductor diode, input terminals, output terminals, means for applying a direct current bias to said diode, means for applying an alternating current bias signal to said diode, of frequency such that a half-period is short compared to the life of an anomalous current carrier, and of frequency substantially higher than that of the signals to be amplified, and means isolating said high frequency bias from said input and output terminals.

2. A semi-conductor amplifier comprising a semi-conductor diode which is susceptible to influence by electron or hole injection, input terminals, output terminals, means for applying a direct current bias to said diode in the low-conducting direction, means for applying an alternating current bias signal to said diode, of frequency such that a half-period is short compared to the life of an anomalous current carrier and of frequency substantially higher than that of the signals to be amplified, the amplitude of said alternating current bias signal being greater than the magnitude of said direct current bias, and means for isolating said high frequency bias from said input and output terminals.

LLOYD P. HUNTER.

References Cited in the file of this patent

UNITED STATES PATENTS

| Number | Name | Date |
|---|---|---|
| 1,765,607 | Ohl | June 24, 1930 |
| 2,418,516 | Lidow | Apr. 8, 1947 |
| 2,469,569 | Ohl | May 10, 1949 |
| 2,486,776 | Barney | Nov. 1, 1949 |